(12) United States Patent
Kobayashi et al.

(10) Patent No.: US 6,900,470 B2
(45) Date of Patent: May 31, 2005

(54) DISPLAY DEVICE AND METHOD OF MANUFACTURING THE SAME

(75) Inventors: Michiya Kobayashi, Fukaya (JP); Kazushige Yamamoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 348 days.

(21) Appl. No.: 10/125,612

(22) Filed: Apr. 19, 2002

(65) Prior Publication Data

US 2002/0158835 A1 Oct. 31, 2002

(30) Foreign Application Priority Data

Apr. 20, 2001 (JP) .......................................... 2001-122485
Apr. 20, 2001 (JP) .......................................... 2001-122884

(51) Int. Cl.[7] .......................... H01L 33/00; H01L 27/15; H01L 31/12; H01L 35/24; H01L 51/00
(52) U.S. Cl. ............................. 257/88; 257/40; 257/59; 257/79; 257/83
(58) Field of Search ........................... 257/79–103, 59, 257/72, 40; 313/498–500, 505–506, 509; 345/76, 92

(56) References Cited

U.S. PATENT DOCUMENTS 6,420,834 B2 * 7/2002 Yamazaki et al. ....... 315/169.3
6,538,374 B2 * 3/2003 Hosokawa ................. 313/504
6,768,257 B1 * 7/2004 Yamada et al. ............ 313/504

FOREIGN PATENT DOCUMENTS

JP            11-8073       1/1999
JP            2000-91083     3/2000

OTHER PUBLICATIONS

Background Art Information.
Translation of the Background Art Information.

* cited by examiner

Primary Examiner—Shouxiang Hu
(74) Attorney, Agent, or Firm—Pillsbury Winthrop Shaw Pittman, LLP

(57) ABSTRACT

An active matrix type planar display device includes display elements arranged in a matrix and auxiliary wiring elements. The display element has an optical active layer between a first electrode formed on a substrate and a second electrode. The auxiliary wiring element is formed in the same layer or on the same surface as the first electrode, electrically insulated from the first electrode, and electrically connected to the second electrode.

11 Claims, 7 Drawing Sheets

| METAL MATERIAL | ELECTRICAL RESISTIVITY ($\mu\Omega$cm) | TRANSPARENT CONDUCTIVE MATERIAL | ELECTRICAL RESISTIVITY ($\mu\Omega$cm) |
|---|---|---|---|
| Ag | 1.6 | ITO | 100~1000 |
| Cu | 1.7 | IZO | 100~1000 |
| APC alloy | 2.2 | | |
| Au | 2.4 | | |
| Al | 3.0 | | |
| Al-Nd alloy | 4.7 | | |
| Ti | 5.0 | | |
| Mo | 5.6 | | |
| W | 5.6 | | |

DISPLAY DEVICE AND METHOD OF MANUFACTURING THE SAME

BACKGROUND OF THE INVENTION

The present invention relates to a planar display device such as an organic electroluminescence (EL) display device, and a method of manufacturing the same. In particular, this invention relates to an active matrix type planar display device and a method of manufacturing the same.

There has been an increasing demand for planar display devices, represented by liquid crystal displays, which are thinner, lighter and less in power consumption than CRT display devices. In particular, active matrix type planar display devices, wherein each display element is provided with a switching device, have been applied to various displays of mobile information apparatuses, etc. The active matrix planar display device has a high display quality, with no crosstalk between adjacent display elements.

Recently, organic electroluminescence (EL) display devices have been widely developed as self-luminescence type displays, which realize higher response speeds and wider angles of view field. The organic EL display device comprises an organic EL panel and an external drive circuit for driving the organic EL panel. The organic EL panel comprises a display region in which display elements are arranged in a matrix on a support substrate of glass, etc., and a drive circuit region for driving the display elements by signals from the external drive circuit. Each display element comprises a first electrode, a second electrode disposed to oppose the first electrode, and an organic light-emission layer disposed between the first and second electrodes.

In the organic EL display device, EL light is let out by a back-face luminescence method in which light is emitted via the support substrate, or a top-face luminescence method in which light is emitted from the side opposing the support substrate. In the active matrix type organic EL display device adopting the back-face luminescence method, circuits of thin film transistors (TFTs), which block transmission of EL light, are disposed under the organic light-emission layer. It is thus difficult to obtain a sufficient opening ratio, posing a problem of how the efficiency in use of light is to be enhanced. On the other hand, the organic EL display device adopting the top-face luminescence method has such a structure that the opening ratio can be determined regardless of the circuits disposed on the support substrate side. Thus, highly efficient use of light is achieved.

In the planar display device, it is imperative that the light-emission-side electrode disposed on the side of light emission be formed of a light-transmissive conductive film. In the case of the active matrix display device using the top-face luminescence method, it is necessary that a common electrode disposed on the light emission side be formed of a light-transmissive conductive film. It is generally known, however, that a transparent conductive material with light transmissivity has a higher resistivity than ordinary metal materials by two or three orders.

The use of transparent conductive material may lead to non-uniformity in electrode voltage in the screen plane of the light-emission-side electrode, degrading the display quality. This problem becomes more conspicuous as the screen size increases. Incidentally, another problem may arise that the screen size needs to be limited.

As has been stated above, in the prior art, it is difficult to use the active matrix display device using the top-face luminescence method.

BRIEF SUMMARY OF THE INVENTION

The present invention has been made in consideration of the above problems, and an object of the invention is to provide a display device capable of suppressing display non-uniformity in a display screen and enhancing the display quality, and a method of manufacturing the same.

Another object of the invention is to provide a display device capable of increasing the degree of freedom in determining the screen size.

Still another object of the invention is to provide an active matrix display device using a top-face luminescence method, and a method of manufacturing the same.

Still another object of the invention is to provide a method of manufacturing a display device without a decrease in productivity.

According to a first aspect of the invention, there is provided a display device comprising a plurality of scan signal lines arranged on a substrate, a plurality of video signal lines arranged substantially perpendicular to the scan signal lines, switching elements disposed near intersections between the scan signal lines and the video signal lines, and display elements each having an optical active layer formed in an insular shape between a first electrode connected to the switching element and a second electrode disposed to oppose the first electrode, the display elements being arranged in a matrix, wherein the display device further comprises an auxiliary wiring element formed in the same layer or on the same surface as the first electrode, electrically insulated from the first electrode, and electrically connected to the second electrode.

According to a second aspect of the invention, there is provided a method of manufacturing a display device wherein display elements, each having an optical active layer between a first electrode formed on a substrate and a second electrode disposed to oppose the first electrode, are arranged in a matrix, the method comprising the steps of:

forming the first electrode and an auxiliary wiring element of a conductive material in one step;

forming an insulating film having a region that exposes the first electrode and the auxiliary wiring element;

forming the optical active layer in the region of the insulating film, which exposes the first electrode; and disposing a light-transmissive conductive film over substantially an entire surface of the substrate to form the second electrode that is opposed to the first electrode via the optical active layer and electrically connected to the auxiliary wiring element.

According to a third aspect of the invention, there is provided a display device comprising a plurality of scan signal lines arranged on a substrate, a plurality of video signal lines arranged substantially perpendicular to the scan signal lines, switching elements disposed near intersections between the scan signal lines and the video signal lines, and display elements each having an optical active layer formed in an insular shape between a first electrode connected to the switching element and a second electrode disposed to oppose the first electrode, the display elements being arranged in a matrix, wherein the first electrode is formed independently for each of the display elements, and the second electrode is formed commonly for the display elements, and auxiliary wiring elements that are electrically insulated from the first electrode and electrically connected to the second electrode are arranged more densely in a central area than in a peripheral area within a surface of the substrate.

According to a fourth aspect of the invention, there is provided a method of manufacturing a display device wherein display elements, each having an optical active layer between an anode formed on a substrate and a cathode disposed to oppose the anode, are arranged in a matrix, the method comprising the steps of:

forming the anode of a conductive material in an insular shape;

forming an auxiliary wiring element of a conductive material;

forming the optical active layer on the anode; and disposing a light-transmissive conductive film over substantially an entire surface of the substrate to form the cathode that is opposed to the anode via the optical active layer and electrically connected to the auxiliary wiring element.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An active matrix type planar display device according to an embodiment of the present invention will now be described in detail with reference to the accompanying drawings. In this embodiment, a self-luminescence type display device, more specifically, an organic EL display device, is described as the active matrix type planar display device.

Figure 1:
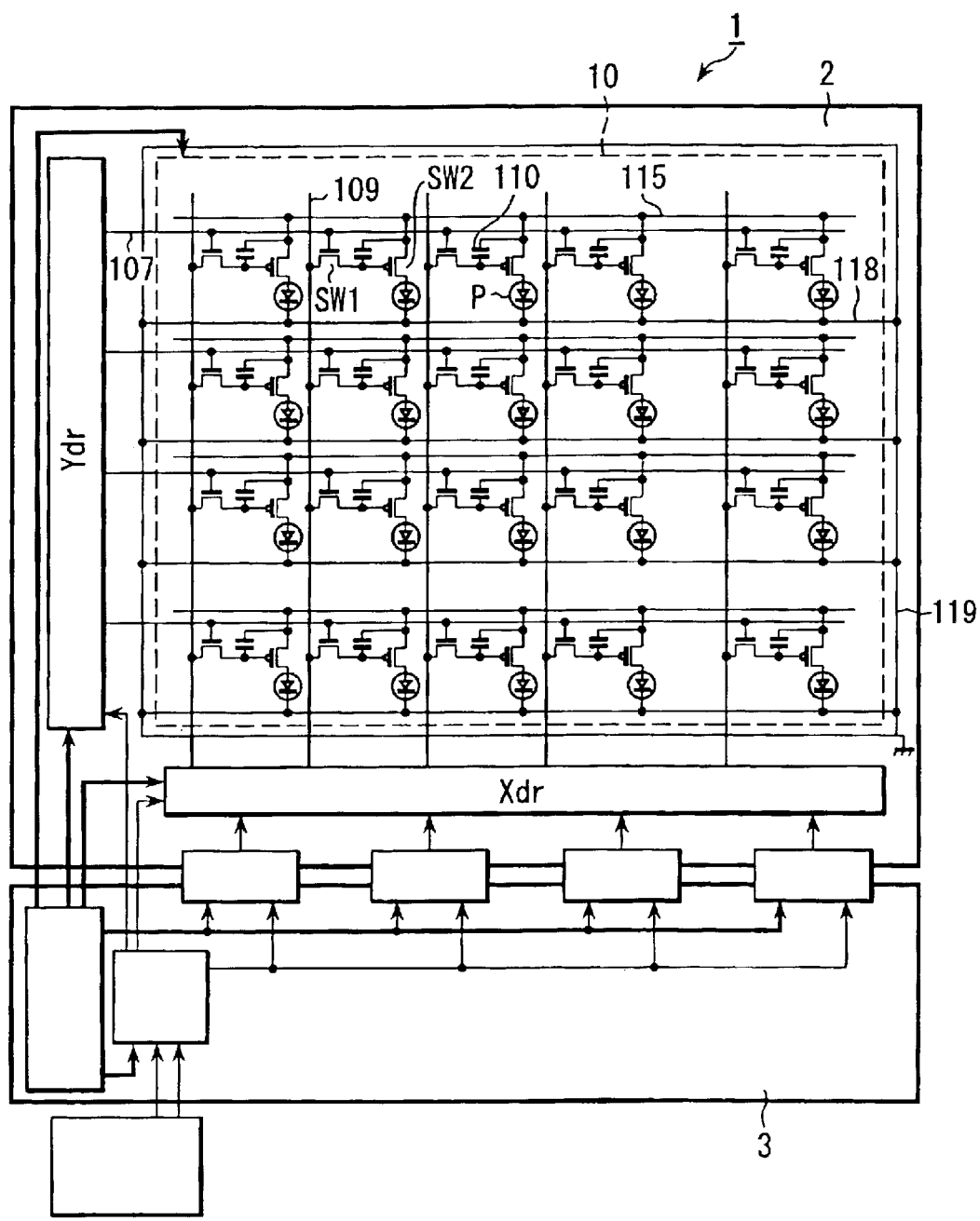
FIG. 1 is a plan view schematically showing the structure of an organic EL display device according to an embodiment of the present invention.
Figure 2:
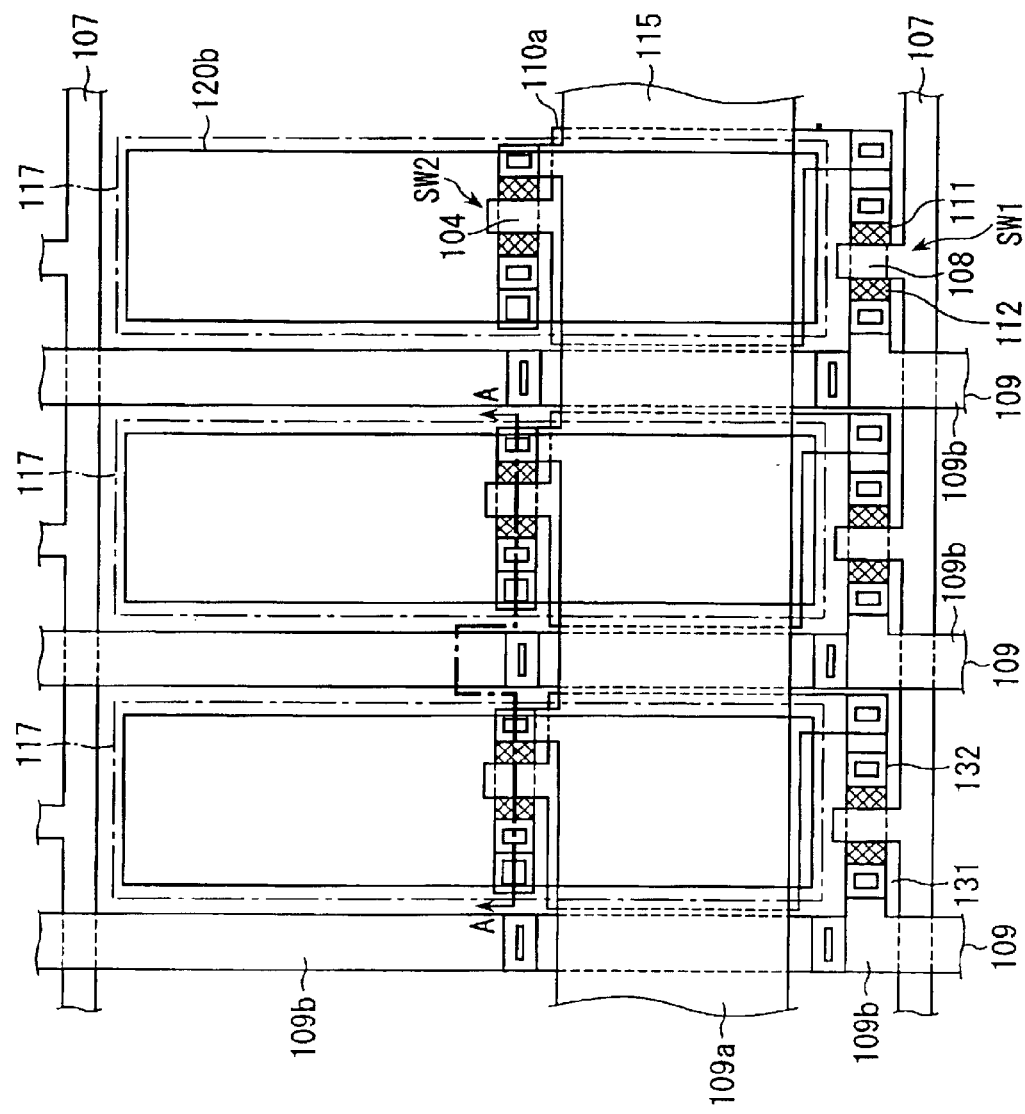
FIG. 2 is a partial plan view schematically showing the structure of a display region of the organic EL display device shown in FIG. 1.
Figures 3, 4:
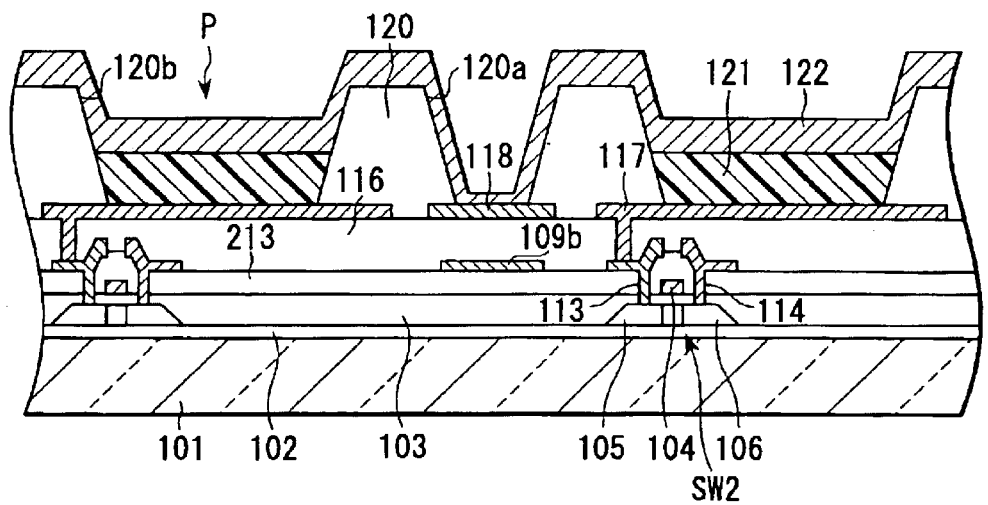
FIG. 3 is a partial cross-sectional view, taken along line A—A in FIG. 2, schematically showing an example of the structure of the display region of the organic EL display device.
FIG. 4 is a table showing resistivities of metal materials and transparent conductive materials.

FIG. 1 is a plan view schematically showing the structure of an organic EL display device according to an embodiment of the present invention. FIG. 2 is a partial plan view schematically showing the structure of a display region of the organic EL display device shown in FIG. 1. FIG. 3 is a cross-sectional view taken along line A—A in FIG. 2.

As is shown in FIGS. 1–3, an active matrix type organic EL display device 1 comprises an organic EL panel 2 and an external drive circuit 3 for driving the organic EL panel 2. The organic EL panel 2 comprises three kinds of display elements P, which respectively emit red, green and blue light. The organic EL panel 2 includes a display region 10 where the display elements P are arranged in a matrix.

Specifically, in this embodiment, the display region 10 has a size of 10.4 (10.4 inches in diagonal dimension). In the display region 10, video signal lines 109 and scan signal lines 107 are arranged in a matrix on an insulative support substrate 101 of glass, etc. A scan signal line drive circuit Ydr for supplying drive pulses to the scan signal lines 107 and a video signal line drive circuit Xdr for supplying drive signals to the video signal lines 109 are disposed at peripheral areas of the display region 10.

In the display region 10, the organic EL panel 2 includes an n-type TFT functioning as a switching element SW1, a capacitor 110 for holding a video signal voltage, a p-type TFT functioning as a driving control element SW2, and an organic EL display element P. The switching element SW1 is formed near each of intersections between the video signal lines 109 and scan signal lines 107. The driving control element SW2 is connected in series to the organic EL display element P. The video signal voltage holding capacitor 110 is connected in series to the switching element SW1 and in parallel to the driving control element SW2.

The organic EL display element P comprises a first electrode 117 formed of a light-reflecting conductive film, which is connected to the driving control element SW2; an organic light-emission layer 121 functioning as a light active layer, which is disposed on the first electrode 117; and a second electrode 122 disposed to be opposed to the first electrode 117 via the organic light-emission layer 121. The organic light-emission layer 121 may comprise three stacked layers, i.e. a hole carrying layer and electron carrying layer, which are common for all the colors, and a light-emission layer formed for each of the different colors. Alternatively, the organic light-emission layer 121 may be formed of two or one function-integrated layer. The organic light-emission layer 121 is formed on that part of the first electrode 117, which is exposed to an opening portion 120b of a partition wall 120 that separates each display element P and is formed of a black resist material with a thickness of 3 μm.

The organic EL display device adopts the top-face luminescence method in which the display surface is provided on the second electrode (light-emission-side electrode) 122 side. The second electrode 122 of display element P is formed of a light-transmissive conductive film. The light-transmissive conductive film is made, for example, by using a transparent conductive material with high transparency, or by thinning a low-transparency material to increase its transparency. In this embodiment, a barium (Ba) layer is thinned to, e.g. 10 nm, so as to have transparency. The barium layer is formed as the transparent conductive film commonly for all display elements. The sheet resistance of this transparent conductive film was about $10^5$ Ω/□.

The organic EL display device of this embodiment includes auxiliary wiring elements 118 electrically connected to the light-transmissive second electrode 122. Specifically, as shown in FIG. 3, the auxiliary wiring element 118 and the first electrode 117 are formed in the same layer or on the same surface, and the auxiliary wiring element 118 is electrically insulated from the first electrode 117 by the partition wall 120. The auxiliary wiring element 118 is electrically connected to the second electrode 122 via a contact portion 120a that is provided in the partition wall 120 so as to expose the auxiliary wiring element 118. The auxiliary wiring elements 118 are formed in a lattice shape so as to surround the first electrode 117 of each display element P. The auxiliary wiring elements 118 are interconnected over the entire display region 10.

The organic EL display device has the auxiliary wiring elements 118, which are electrically connected to the second electrode 122 and uniformly provided over the entire display region 10. Thus, a potential variance can be suppressed within the screen surface of the light-emission side electrode, i.e. the second electrode 122.

It is desirable that the auxiliary wiring element 118 be formed of an electrically conductive material having a sufficiently low resistivity, compared to the conductive material of the second electrode 122. More specifically, the auxiliary wiring element 118 should preferably be formed of a conductive material having a resistivity of $11 \times 10^{-6}$ Ωcm. By forming the auxiliary wiring element 118 of the low-resistance conductive material, the potential variance within the screen surface of the light-emission-side electrode can further be reduced.

FIG. 4 shows the electrical resistivity ($\mu\Omega$cm) of typical metal materials chosen for the auxiliary wiring element 118 and the electrical resistivity ($\mu\Omega$cm) of transparent conductive materials. It is preferable, in particular, that the auxiliary wiring element 118 be formed of a conductive material with a resistivity of $1 \times 10^{-6}$ Ωcm to $6 \times 10^{-6}$ Ωcm. For example, the auxiliary wiring element 118 is formed of the following metals or alloys: silver (resistivity: 1.6 $\mu\Omega$cm), copper (1.7 $\mu\Omega$cm), silver-palladium-copper alloy (2.2 $\mu\Omega$cm); gold (2.4 $\mu\Omega$cm), aluminum (3.0 $\mu\Omega$cm), aluminum-neodymium alloy (4.7 $\mu\Omega$cm), titanium (5.0 $\mu\Omega$cm), molybdenum (5.6 $\mu\Omega$cm), and tungsten (5.6 $\mu\Omega$cm). Alternatively, a composite material of these may be used.

In this embodiment, the auxiliary wiring element 118 is formed of the same material as the first electrode 117. For example, it is formed of three stacked layers of aluminum (Al), molybdenum (Mo) and indium-tin-oxide (ITO). This stacked body is formed to have a resistivity of $4 \times 10^{-6}$ $\mu\Omega$cm and a sheet resistance of $10^{-1}$ $\mu\Omega$/□. The Mo is provided to prevent corrosion of ITO and Al due to their direct contact. The Mo may be replaced with other metals having the same function, such as titanium (Ti) and tungsten (W).

As has been described above, the first electrode 117 functions as the anode of the organic EL display element, and the second electrode 122 as the cathode thereof. It is desirable to use optimal materials depending on the polarity of the electrode. When the auxiliary wiring element 118 and the first electrode 117 are formed by the same process, it is imperative to choose the conductive material that has a low resistance and functions with good performance as the electrode.

Figure 5A:
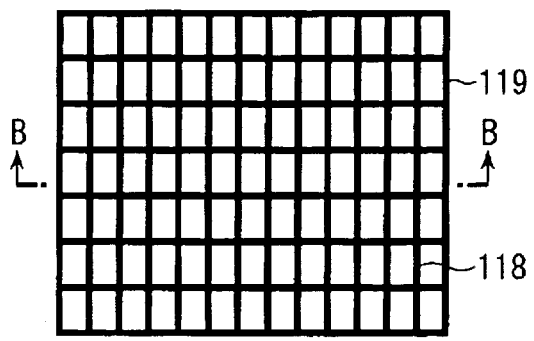
FIGS. 5A to 5F are plan views showing examples of arrangement of auxiliary wiring and second electrode power supply lines according to the embodiment of the invention.
Figure 5D:
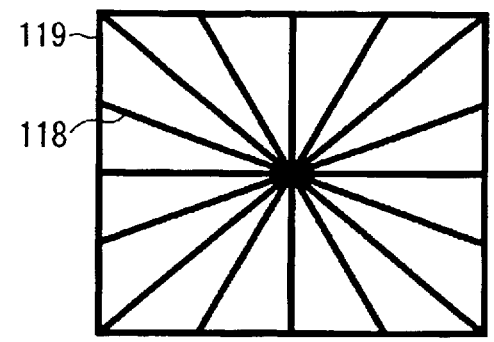
Figure 5B:
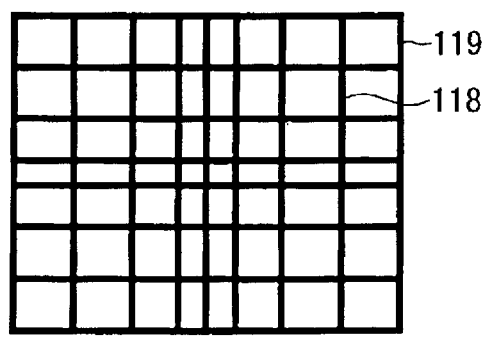
Figure 5E:
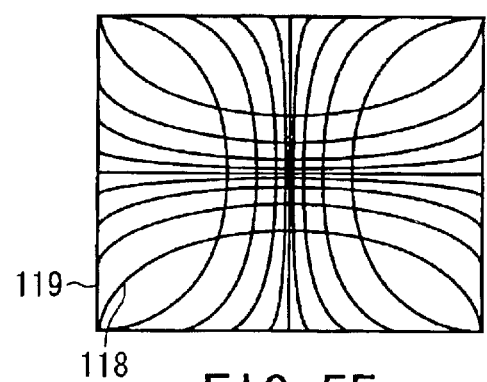
Figure 5C:
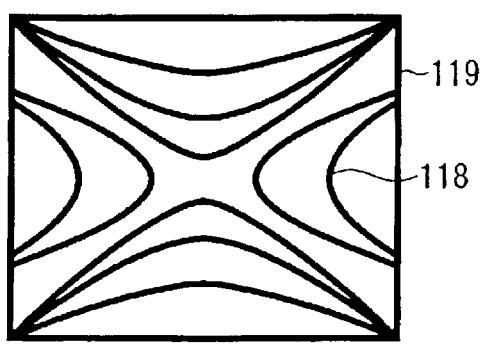
Figure 5F:
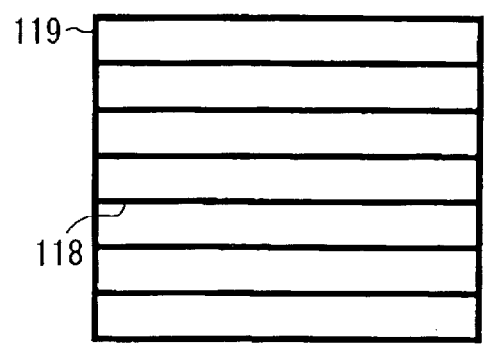
Figure 6A:
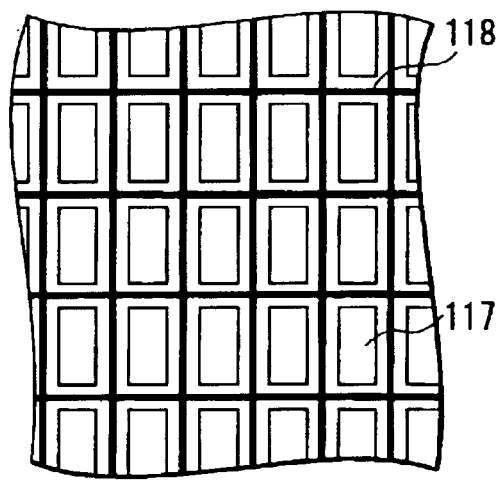
FIGS. 6A to 6C are plan views showing examples of arrangement of a first electrode and auxiliary wiring according to the embodiment of the invention.
Figure 6B:
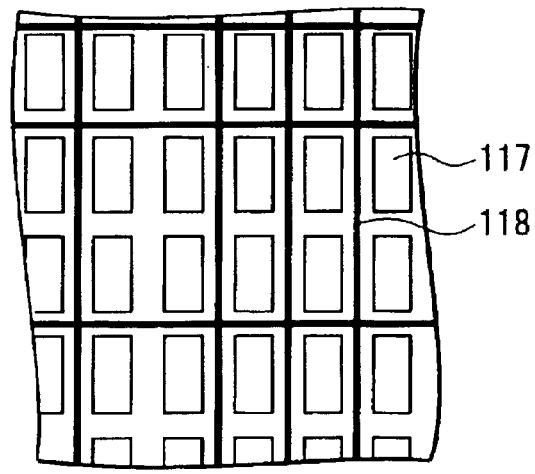
Figure 6C:
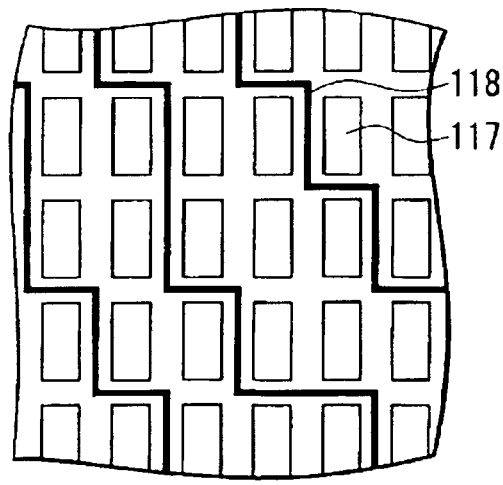

FIGS. 5A to 5F show examples of arrangement of auxiliary wiring element 118 and second electrode power supply lines, and FIGS. 6A to 6C are enlarged views of display regions in FIGS. 5A to 5C.

In the above-described embodiment, as shown in FIGS. 5A and 6A, auxiliary wiring elements 118 surround the first electrode 117 of each display element P and are interconnected and uniformly patterned on the display region. Alternatively, the auxiliary wiring elements 118 may be formed with various patterns. It should suffice if the auxiliary wiring elements 118 are electrically isolated from the first electrodes 117 and electrically connected to the second electrode 122.

For example, the auxiliary wiring elements 118 may be arranged with varying density within the panel surface. As is shown in FIGS. 5B and 6B, the auxiliary wiring elements 118 may be formed within second electrode power supply lines 119 arranged in a rectangular shape to surround the display region such that the density of arrangement is high at a central area far from the second electrode power supply lines 119 and low at peripheral areas near the second electrode power supply lines 119.

The auxiliary wiring elements 118 may not linearly be arranged. As is shown in FIGS. 5C to 5E and FIG. 6C, the auxiliary wiring elements 118 may be arranged in a zigzag shape along the peripheries of first electrodes 117.

Furthermore, as shown in FIG. 5F, the auxiliary wiring elements 118 may be formed in stripes within the second electrode power supply lines 119. Alternatively, the pixels may be varied in size for colors, and the sizes of auxiliary wiring elements may be determined in accordance with the distance between adjacent first electrodes. Optimal patterns may be adopted depending on conditions such as the screen size and the number of pixels.

The organic EL display device 1 is of the active matrix type wherein the first electrodes 117 are formed in independent insular shapes and the second electrode 122 is provided commonly for all the display elements P. Thus, auxiliary wiring elements 118 connected between adjacent pixels may be provided in the same plane as the first electrodes 117.

The same plane in this context refers to not only a planar plane but also a plane with unevenness or steps. In addition, the layer in which the first electrodes 117 are formed may partly be formed of different materials in the direction of extension of the layer. In short, it refers to the same plane in the thickness direction of the stacked structure.

Since the auxiliary wiring element 118 with fixed potential is provided between adjacent display elements P, capacitive coupling between pixels can be suppressed and factors of degradation in display quality, such as crosstalk, can be eliminated. Thus, the display device with high quality can be provided.

In the top-face luminescence type, when the first electrode 117 is formed on the TFTs (SW1 and SW2) via an insulating layer 116, the display element P can be formed over the TFTs (overlapping structure) and wiring under the insulating layer 116. Thus, the opening ratio can be determined irrespective of circuits such as TFTs, and high efficiency of use of light can be achieved.

In the above-described embodiment, the thin Ba film is used as the transparent electrode material of the upper electrode (second electrode) 122 of display element P. Alternatively, various transparent conductive materials can be selectively used. It is desirable to use the material suitable for the organic light-emission layer 121. The second electrode 122 may be formed of a plurality of stacked films, and ITO or tin oxide (SnO) may be stacked on a thin film of Ba or calcium (Ca). When the second electrode 122 is used as an anode, ITO or IZO (indium Zn oxide) with high transparency may be used as a transparent electrode material. It is also desirable to choose the material suitable for the organic light-emission layer 121 as the metal material of the lower electrode (first electrode) 117 of display element P. It is also preferable to choose the material suitable for the polarity of the electrode.

As has been described above, according to the embodiment, the auxiliary wiring element 118 is electrically connected to the second electrode 122. Thus, the resistance of the entire light-emission-side electrode can be lowered, and non-uniformity in display within the display screen can sufficiently be suppressed.

A method of fabricating the organic EL panel 2 will now be described.

An undercoat layer 102 is formed by depositing an SiN film and/or an SiO$_2$ film on an insulating support substrate 101 of glass, etc. by means of atmospheric-pressure CVD or plasma CVD. An amorphous silicon film is deposited on the undercoat layer 102. P-type impurities of boron (B), etc. may be doped in the entire surface of the substrate in order to control thresholds of TFTs.

Then, an excimer laser beam is radiated on the amorphous silicon film to anneal it. Thus, the amorphous silicon layer is crystallized into a polysilicon film. Subsequently, the polysilicon film is subjected to a photolithography process comprising a series of steps of resist-coating, exposure, patterning and etching. Thereby, the polysilicon film is formed in insular shapes.

Thereafter, a silicon oxide (SiOx) film is formed over the entire surface of the substrate so as to cover the polysilicon film, thereby a gate insulating film 103 is formed. A MoW film is deposited as a gate metal film on the gate insulating film 103. The MoW film is subjected to a photolithography process to form a gate electrode 104 of a p-type TFT. Furthermore, boron (B) is doped to form a source region 105 and a drain region 106, which are conductive regions, in the polysilicon film of the p-type TFT.

The MoW gate metal film is then subjected to a photolithography process to form a scan signal line 107, a gate electrode 108 integral with the scan signal line 107, a portion 109a of a video signal line 109, and a lower electrode pattern 110a of a video signal voltage holding capacitor 110.

Using as a mask the gate electrode 108 or the resist at the time of forming the gate electrode, phosphorus (P) ions are doped from above to form a source region 111 and a drain region 112 in the polysilicon film of an n-type TFT.

Subsequently, an SiOx film is formed by CVD to cover the entire surface of the substrate, thereby an interlayer insulating film 213 is formed. Then, contact holes are formed, which penetrate the interlayer insulating film 213 and gate insulating film 103 and reach the source regions 105 and 111 and the drain regions 106 and 112 of the polysilicon film.

By sputtering, etc., a three-layer metal film comprising Mo/Al/Mo in succession is formed. Then, a photolithography process is performed to form a source electrode 113 connected to the source region 105, a drain electrode 114 connected to the drain region 106, an organic EL current supply line 115 integral with the drain electrode 114, and a portion 109b of the video signal line 109.

The portion 109b of the video signal line is electrically connected to the previously formed portion 109a via the contact hole, thus constituting the video signal line 109. In addition, the portion 109b of the video signal line is electrically connected to the drain region 112 of n-type TFT (SW1) via the contract hole, thus constituting the drain electrode 131. Besides, the source electrode 132 electrically connected to the source region 111 of n-type TFT (SW1) via the contact hole is electrically connected to the lower electrode pattern 110a of video signal voltage holding capacitor 110.

Thus, the n-type TFTs functioning as the switching elements SW1 and the p-type TFTs functioning as the driving control elements SW2 are formed. At the same process, the video signal line drive circuit Xdr and scan signal line drive circuit Ydr in the drive circuit region, which are composed by combining the n-type TFTs and p-type TFTs, are formed. In addition, the video signal voltage holding capacitor 110 is formed, with the organic EL current supply line 115 formed as the upper electrode.

After an SiNx film is provided by CVD to form an insulating layer 116, a contact hole is formed which reaches the source electrode 113 of driving control element SW2. Subsequently, by sputtering, etc., a three-layer metal film comprising Al/Mo/ITO in succession is formed. Then, a photolithography process is performed to form a light-reflecting first electrode 117 of display element P, an auxiliary wiring element 118, and a second electrode power supply line 119 formed integral with the auxiliary wiring element 118 in a rectangular shape surrounding the display region 10.

As described above, the auxiliary wiring element 118 and first electrode 117 are formed in the same step by using the same conductive material. Accordingly, the auxiliary wiring element 118 can be formed without providing an additional step of forming the auxiliary wiring step 118. Moreover, the first electrode 117 of display element P is disposed on the insulating layer 116 and connected to the source electrode 113 of driving control element SW2 via the insulating layer 116. Thus, the first electrode 117, driving control element SW2 and switching element SW1 can be formed in an overlapping structure, and the area of the first electrode 117 can be increased.

Following the above, a black organic resist material is coated on the entire surface of the substrate such that the film thickness of the dried resist material may become 3 μm. Then, a partition wall 120 including regions exposing the first electrode 117 and auxiliary wiring element 118 is formed by photolithography. Specifically, the partition wall 120 includes an opening portion 120b exposing the first electrode 117 at a position corresponding to the first electrode 117, and a contact portion 120a exposing the auxiliary wiring element 118 at a position corresponding to the auxiliary wiring element 118.

The partition wall 120 is formed so as to surround the display element P, and separates each display element P. In order to prevent leak of EL light between adjacent display elements, the partition wall 120 should preferably be formed of a light-shielding black material. In addition, in order to surely separate each display element P, the partition wall 120 should preferably have a film thickness equal to or more than the film thickness of the organic light-emission layer 121, and to have such a shape and a height as not to cause cut of the second electrode 122 at the contact portion 120a with the auxiliary wiring element 118.

For example, when the organic light-emission layer 121 is to be formed of a macromolecular material, as in the present embodiment, the organic light-emission layer is formed by an ink jet method, as will be described later. In order to isolate a liquid drop of the organic light-emission layer material by the partition wall 120, it is desirable that the thickness of the partition wall 120 be 1 µm or more. When the organic light-emission layer 121 is formed of a low molecular weight material, it should suffice if the thickness of the partition wall 120 is equal to or more than the thickness of the organic light-emission layer 121 and, specifically, 100 nm or more. It is preferable that the partition wall 120 is shaped to have a taper angle of 80° or less so that the second electrode 122 may not be cut by stepping at the contact portion 120*a* that contacts the auxiliary wiring element 118.

In this embodiment, the contact portion 120*a* that contacts the auxiliary wiring element 118 is formed in a stripe pattern that is continuous along the auxiliary wiring element 118. Alternatively, it may be formed in a discontinuous dot pattern along the auxiliary wiring element 118.

Subsequently, macromolecular organic light-emission materials corresponding to red (R), green (G) and blue (B) are successively jetted out by an ink jet method. Thus, organic light-emission layers 121 of the respective colors are selectively formed on areas corresponding to the openings exposing the first electrodes 117.

Using sputtering, etc., a layer of light-transmissive conductive material (Ba in this embodiment) with a thickness of 10 nm is formed on the entire surface of the substrate including the organic light-emission layers 121. Thus, a second electrode 122 is formed. The second electrode 122 opposes the first electrodes 117 via the organic light-emission layers 121. The second electrode 122 is electrically connected to the auxiliary wiring element 118 formed on the insulating layer 116 in the same plane as the first electrode 117.

Thereafter, a transparent insulating substrate of glass, etc. is disposed as a sealing substrate to oppose the support substrate 101. The peripheries of the substrates are sealed, and an organic EL panel 2 is obtained.

In the above embodiment, the organic light-emission layer 121 is formed of the macromolecular organic light-emission material. Alternatively, the organic light-emission layer 121 may be formed of a low-molecular-weight organic light-emission material of $Alq_3$, etc. When the low-molecular-weight organic light-emission material is used, the organic light-emission layer 121 may be formed by vacuum vapor deposition, etc.

Since the second electrode 122 is electrically connected to the auxiliary wiring element 118, the resistance of the entire light-emission-side electrode can be decreased and non-uniformity in display within the display screen can sufficiently be suppressed.

Since the top-face luminescence method is adopted, the display element P can be disposed in an overlapping manner via the insulating layer 116 on the circuit formed on the support substrate 101. Compared to the back-face luminescence method, the opening ratio can be increased and an organic EL display device 1 with a high opening ratio is realized. Thus, the panel-face luminance can be increased. Moreover, compared to the back-face luminescence method, the power consumption for achieving a predetermined panel-face luminance can be decreased, and the life of the organic EL device can be made longer.

Since the auxiliary wiring element 118 can be formed of the same material as the first electrode 117 in the same step, there is no need to provide an additional step of forming the auxiliary wiring element 118, and an increase in the number of steps can be prevented.

Besides, a top-face luminescence display panel of an active matrix display device, wherein the second electrode 122 that is the common electrode is formed of a cathode material, can be realized.

Another example of the structure of the organic EL display device 1 will now be described.

Figure 7:
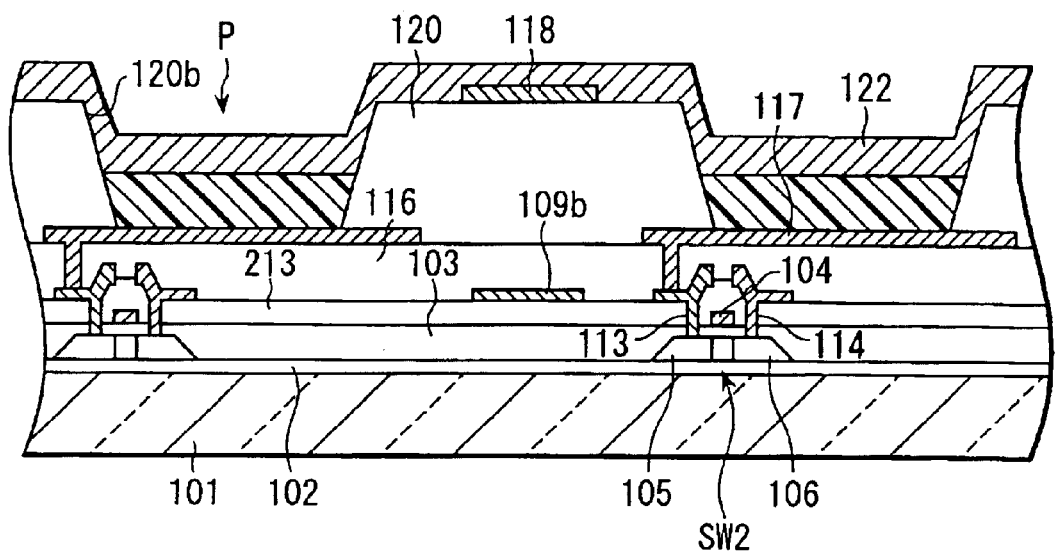
FIG. 7 is a partial cross-sectional view, taken along line A—A in FIG. 2, schematically showing another example of the structure of the display region of the organic EL display device.
Figure 8:
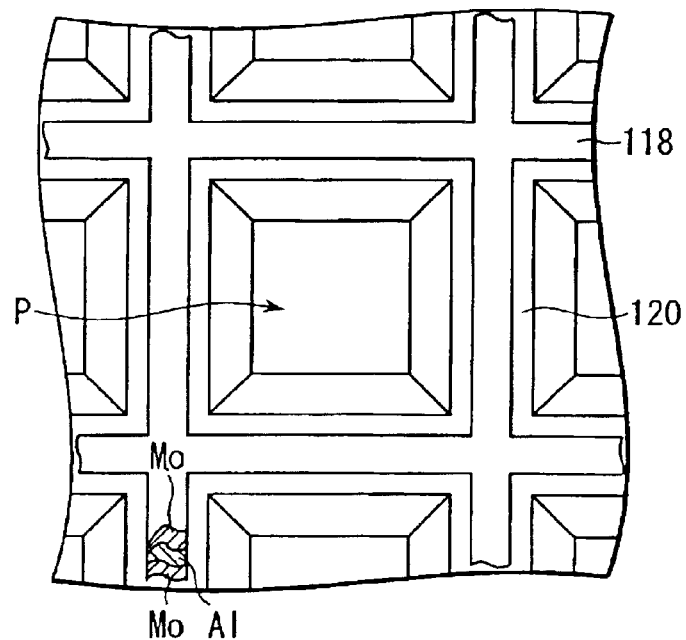
FIG. 8 is a partial plan view schematically showing an example of arrangement of auxiliary wiring in the display region of the organic EL display device shown in FIG. 7.

Specifically, as shown in FIGS. 7 and 8, auxiliary wiring elements 118 electrically connected to the second electrode 122 are disposed in a lattice shape on partition walls 120 that electrically isolate the pixels in the display region 10. Each auxiliary wiring element 118 is commonly electrically connected to the second electrode power supply line 119 for supplying power to the second electrode 122. The auxiliary wiring elements 118 are interconnected over the entire display region 10.

As is shown in FIG. 8, the auxiliary wiring element 118 has a MAM structure (Mo/Al/Mo) in which aluminum (Al) is sandwiched by molybdenum (Mo). The resistivity of the auxiliary wiring element 118 with the MAM structure is about 3 µΩcm.

In order to prevent a local voltage drop of the second electrode 122, it is desirable that the auxiliary wiring elements 118 be arranged in a lattice shape, as shown in FIG. 8, so as to surround the pixels of all display elements P. By electrically connecting the arranged auxiliary wiring elements 118 and second electrode 122, non-uniformity in voltage within the screen due to the resistance of the second electrode 122 can be suppressed. Thus, a uniform electrode potential can be supplied over the entire display region 10. Accordingly, non-uniformity in display can be suppressed, and the quality in display enhanced.

In the above-described embodiment, as shown in FIG. 5A, the auxiliary wiring elements 118 are arranged in a lattice shape so as to surround all pixels. The arrangement is not limited to this. In a case where the resistance of the second electrode 122 is higher in the central area of the display region 10, which is away from the second electrode power supply line 119, than in the peripheral area of the display region 10, which is near the second electrode power supply line 119, the same advantage as in the present embodiment can be obtained with the following arrangement. That is, as shown in FIGS. 5B to 5E, the auxiliary wiring elements 118 are arranged relatively densely in the central area of the display region 10 and relatively thinly in the peripheral area of the display region 10.

In the organic EL display device with this structure, the first electrode 117 of the display element P, the partition wall 120, and the auxiliary wiring element 118 on the partition wall 120 are successively formed. Then, the organic light-emission layer 121 is formed on the first electrode 117.

In the step of forming the organic light-emission layer, the ink jet method is adopted. In this case, attraction force is controlled to act between the first electrode 117, on which the organic light-emission layer is to be formed, and the liquid drop of organic light-emission material. Alternatively, repulsive force may be controlled to act between the liquid drop and another first electrode 117. Alternatively, repulsive force with the auxiliary wiring element 118 or other wiring may be adjusted in accordance with the structure.

For example, the precision in jetting the organic light-emission material may be enhanced by an electric field produced between the nozzle of the ink jet device, which discharges the liquid drop of organic light-emission material, and the auxiliary wiring element 118, or between the first electrode and the nozzle.

Specifically, a voltage (E2) is applied between the first electrode 117 and auxiliary wiring element 118. At the same time, a voltage (E1+E2) is applied between the first electrode 117 and the nozzle. Thereby, a positive charge is applied to the first electrode 117, and a negative charge is applied to the auxiliary wiring element 118 and nozzle. The values of applied voltages E1 and E2 are adjusted at optimal values, depending on conditions of application of liquid drops, e.g. the size of the liquid drop discharged from the nozzle, the speed of the discharged liquid drop, and the distance between the nozzle and the first electrode that is the target.

Consequently, the liquid drop in the nozzle has a negative charge. When the liquid drop is discharged from the nozzle and goes toward the auxiliary wiring element 118, away from the target, i.e. the first electrode 117, the liquid drop is turned back by the repulsive force exerted by the auxiliary wiring element 118 and attracted by the first electrode 117. Accordingly, the trajectory of the liquid drop from the nozzle can be corrected to the direction toward the target, i.e. the first electrode 117.

Measurement results of the panel-face luminance of the organic EL display device will now be described.

Figure 9:
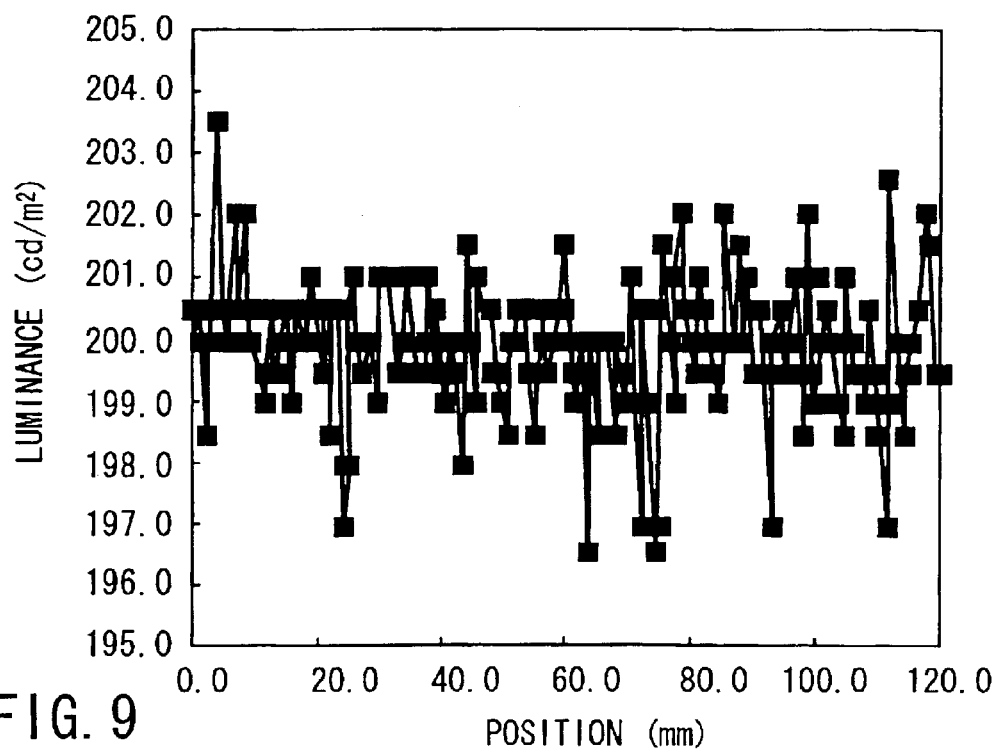
FIG. 9 is a graph showing a measurement result of a panel-face luminance of the organic EL display device, as measured along line B—B in FIG. 5A.

FIG. 9 is a graph plotting the panel-face luminance measured along line B—B in FIG. 5A of the organic EL display device 1 that has auxiliary wiring elements 118 with a pattern shown in FIG. 5A. The panel-face luminance was measured using a spectroscopic luminance meter. In the luminance measurement, the spot size of the spectroscopic luminance meter was set at 0.7 mm. Accordingly, the spatial resolution of the panel-face luminance was 0.7 mm. The driving current was adjusted such that the panel-face luminance might become 200 $cd/m^2$.

As is shown in FIG. 9, it was confirmed that the luminance distribution along line B—B in the organic EL display device 1 with the above structure was limited within the range of 200 $cd/m^2 \pm 3$ $cd/m^2$ over the entire display region 10, and that the display in 32 gradients was achievable.

For comparison, the panel-face luminance of an organic EL display device with no auxiliary wiring elements 118 was measured.

Figure 10:
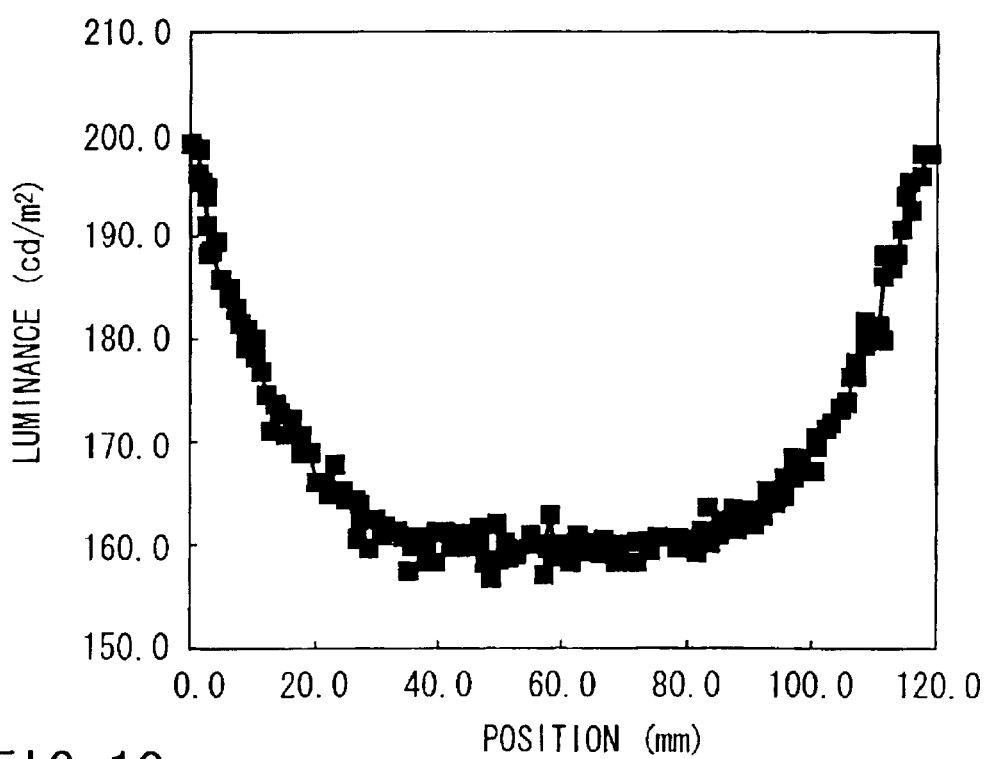
FIG. 10 is a graph showing a measurement result of a panel-face luminance of an organic EL display device, which is not provided with auxiliary wiring.

FIG. 10 is a graph plotting the panel-face luminance measured in this organic EL display device for comparison. The conditions for measurement were the same. As is shown in FIG. 10, it was confirmed that in the comparative example, a luminance of about 200 $cd/m^2$ was obtained at the peripheral area of the display region, but the luminance decreased to about 160 $cd/m^2$ at the central area of the display region.

As is understood from these measurement results, in the top-face luminescence type organic EL display device 1, a local voltage drop of the light-emission-side electrode (the second electrode (cathode) 122 in this embodiment) can be prevented. Compared to the prior art, non-uniformity in electrode potential within the screen surface can be sufficiently reduced. In this embodiment, the luminance distribution within the surface was successfully limited within ±3 $cd/m^2$, despite the screen size exceeding a 10-inch size. Therefore, a display performance with high display quality, which is free from non-uniformity in display, can be realized.

As has been described above, according to this organic EL display device, the circuit components are integrated on the support substrate. The display elements are disposed over the circuit components. The light-transmissive electrode is position in the side opposite to the support substrate. EL light is emitted from the light-transmissive electrode side. With the top-face luminescence method adopted, the high opening ratio can be obtained, despite the area occupied by the circuit components.

In order to obtain a desired panel-face luminance, there is no need to excessively increase the driving current density for display elements. As a result, the life of the display elements can be made longer, and the reliability in performance of the display device can be enhanced.

When the light-emission-side electrode is formed of a light-transmissive conductive material, the resistivity thereof is higher than general metals and a local voltage drop may occur in the display region. To solve this problem, auxiliary wiring elements having a lower resistance than the light-transmissive conductive material are disposed at least in a high-resistance area, and the auxiliary wiring elements are electrically connected to the second electrode. The auxiliary wiring elements are electrically connected to the second electrode power supply line for supplying power to the second electrode, and the auxiliary wiring elements and the second electrode are set at the same potential. Thus, over the entire display region, non-uniformity in potential of the second electrode can be suppressed, non-uniformity in display suppressed, and the display quality enhanced.

The present invention is not limited to the above-described organic EL display device having the organic light-emission layer as the active layer. Needless to say, this invention is applicable to general planar display devices wherein optical active layers are independently formed in insular shapes for respective pixels.

As has been described above, this invention provides a planar display device with high display quality, in which non-uniformity in display is suppressed. Furthermore, the planar display device can be provided without increasing the number of fabrication steps.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A display device comprising:

a plurality of scan signal lines arranged on a substrate;

a plurality of video signal lines arranged substantially perpendicular to the scan signal lines;

switching elements disposed near intersections between the scan signal lines and the video signal lines; and display elements each having an optically active layer formed in an insular shape between a first electrode connected to one of the switching elements and a second electrode disposed to oppose the first electrode, the display elements being arranged in a matrix, wherein the display device further comprises an auxiliary wiring element formed in a same layer as the first electrode, electrically insulated from the first electrode, and electrically connected to the second electrode.

2. A display device according to claim 1, wherein the first electrode and the auxiliary wiring element are formed of a same material.

3. A display device according to claim 1, wherein the auxiliary wiring element has a lower resistance than the second electrode.

4. A display device according to claim 1, wherein the optically active layer is formed of an organic light-emitting material.

5. A display device according to claim 1, wherein the second electrode is formed of a light-transmissive conductive material.

6. A display device according to claim 5, wherein light is emitted via the second electrode.

7. A display device according to claim 1, further comprising partition walls which isolate display elements and which are arranged on the auxiliary wiring element, wherein the second electrode is electrically connected to the auxiliary wiring element through a contact portion provided in the partition walls in such a manner that the auxiliary wiring element is exposed.

8. A display device according to claim 1, further comprising a partition wall which electrically insulates the auxiliary wiring element from the first electrode.

9. A display device according to claim 8, wherein the partition wall contacts the second electrode and the optically active layer.

10. A display device according to claim 1, wherein the first electrode and the auxiliary wiring element have substantially a same thickness.

11. A display device according to claim 1, wherein the first electrode and the auxiliary wiring element have a same thickness.

* * * * *